(12) United States Patent
Remmele et al.

(10) Patent No.: US 9,588,205 B2
(45) Date of Patent: Mar. 7, 2017

(54) SIMULTANEOUS AND DYNAMIC DETERMINATION OF LONGITUDINAL AND TRANSVERSAL RELAXATION TIMES OF A NUCLEAR SPIN SYSTEM

(75) Inventors: Stefanie Remmele, Hamburg (DE); Wei Liu, Rockville, MD (US); Tobias Ratko Voigt, London (GB); Christian Stehning, Hamburg (DE)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 1044 days.

(21) Appl. No.: 13/582,800

(22) PCT Filed: Mar. 10, 2011

(86) PCT No.: PCT/IB2011/051001
§ 371 (c)(1),
(2), (4) Date: Sep. 5, 2012

(87) PCT Pub. No.: WO2011/114264
PCT Pub. Date: Sep. 22, 2011

(65) Prior Publication Data
US 2012/0326721 A1 Dec. 27, 2012

Related U.S. Application Data

(60) Provisional application No. 61/315,062, filed on Mar. 18, 2010.

(51) Int. Cl.
*G01R 33/50* (2006.01)
*G01R 33/56* (2006.01)
*G01R 33/561* (2006.01)

(52) U.S. Cl.
CPC .......... *G01R 33/50* (2013.01); *G01R 33/5601* (2013.01); *G01R 33/5613* (2013.01); *G01R 33/5616* (2013.01)

(58) Field of Classification Search
USPC ........................ 324/300–322; 600/407–435; 382/128–131
See application file for complete search history.

(56) References Cited

U.S. PATENT DOCUMENTS 5,245,282 A * 9/1993 Mugler, III ........ G01R 33/4835
324/309
6,205,349 B1 3/2001 Kim et al.
(Continued)

FOREIGN PATENT DOCUMENTS

EP 1136836 A2 9/2001
JP 04288141 A 10/1992
(Continued)

OTHER PUBLICATIONS

Heilmann, M., et al.; Simultaneous dynamic T1 and T*2 measurement for AIF assessment combined with DCE MRI in a mouse tumor model; 2007; Magnetic Resonance Materials in Physics, Biology and Medicine; 20(4)193-203.
(Continued)

*Primary Examiner* — Melissa Koval
*Assistant Examiner* — Tiffany Fetzner (57) ABSTRACT

The invention relates to a magnetic resonance imaging method for simultaneous and dynamic determination of a longitudinal relaxation time $T_1$ and a transversal relaxation time $T_2$ of the nuclear spin system of an object, in the context of DCE or DSE MRI. In this respect, the invention makes use of a steady-state gradient echo pulse sequence comprising an EPI readout module.

10 Claims, 4 Drawing Sheets

(56) References Cited

U.S. PATENT DOCUMENTS

| | | | | |
|---|---|---|---|---|
| 6,291,996 B1* | 9/2001 | Glover | G01R 33/50 324/307 |
| 7,081,751 B2* | 7/2006 | Twieg | G01R 33/561 324/307 |
| 8,143,889 B2* | 3/2012 | Jeong | G01R 33/5616 324/307 |
| 2004/0227512 A1* | 11/2004 | Twieg | G01R 33/561 324/309 |
| 2010/0213938 A1* | 8/2010 | Jeong | G01R 33/5616 324/309 |
| 2012/0326721 A1* | 12/2012 | Remmele et al. | 324/309 |
| 2015/0310598 A1* | 10/2015 | Rooney | G06T 7/0016 382/131 |

FOREIGN PATENT DOCUMENTS

| | | |
|---|---|---|
| JP | 06237914 A | 8/1994 |
| JP | 06335471 A | 12/1994 |
| WO | 9909428 A1 | 2/1999 |

OTHER PUBLICATIONS

Ishimori, Y., et al.; Dynamic T1 Estimation of Brain Tumors Using Double-Echo Dynamic MR Imaging; 2003; Journal of Magnetic Resonance Imaging; 18:113-120.

Kim, E., et al.; Separation of T1 and T2* shortening effects using simultaneous T1/T2* gradient dual echo pulse sequence; 2003; Proc. Intl. Soc. Mag. Reson. Med.; 11:1246.

Schad, L. R., et al.; Two-Exponential Analysis of Spin-Spin Proton Relaxation Times in MR Imaging Using Surface Coils; 1989; Magnetic Resonance Imaging; 7(4)357-362.

Vautier, J., et al.; 2D and 3D Radial Multi-Gradient-Echo DCE MRI in Murine Tumor Models with Dynamic R*2-corrected R1 Mapping; 2010; Magnetic Resonance in Medicine; 64:313-318.

Warntjes, J. B. M., et al.; Novel Methods for Rapid, Simultaneous T1, T*2, and Proton Density Quantification; 2007; Magnetic Resonance in Medicine; 57:528-537.

Franiel, T., et al.; Prostate MR Imaging: Tissue Characterization with Pharmacokinetic Volume and Blood Flow Parameters and Correlation with Histologic Parameters; 2009; Radiology; 252(1)101-108.

OConnor, J.P.B., et al.; Comparison of normal tissue R1 and R*2 modulation by oxygen and carbogen; 2009; MRM; 61(1)75-83.

Lebon, V., et al.; Simultaneous measurement of perfusion and oxygenation changes using a multiple gradient-echo sequence: application to human muscle study; 1998; 16(7)721-729.

* cited by examiner

SIMULTANEOUS AND DYNAMIC DETERMINATION OF LONGITUDINAL AND TRANSVERSAL RELAXATION TIMES OF A NUCLEAR SPIN SYSTEM

CROSS REFERENCE TO RELATED APPLICATIONS

This application claims the benefit of U.S. provisional application Ser. No. 61/315,062 filed Mar. 18, 2010, which is incorporated herein by reference.

FIELD OF THE INVENTION

The invention relates to a magnetic resonance imaging method for simultaneous determination of a longitudinal relaxation behavior and a transversal relaxation behavior of a nuclear spin system of an object, a computer program product, as well as a magnetic resonance imaging apparatus.

BACKGROUND OF THE INVENTION

Image-forming MR methods, which utilize the interaction between magnetic field and nuclear spins in order to form two-dimensional or three-dimensional images are widely used nowadays, notably in the field of medical diagnostics, because for the imaging of soft tissue they are superior to other imaging methods in many respects, they do not require ionizing radiation, and they are usually not invasive.

According to the MR method in general, the body of a patient or in general an object to be examined is arranged in a strong, uniform magnetic field $B_0$ whose direction at the same time defines an axis, normally the z-axis, of the coordinate system on which the measurement is based.

The magnetic field produces different energy levels for the individual nuclear spins in dependence on the applied magnetic field strength which spins can be excited (spin resonance) by application of an alternating electromagnetic field (RF field) of defined frequency, the so called Larmor frequency or MR frequency. From a macroscopic point of view the distribution of the individual nuclear spins produces an overall magnetization which can be deflected out of the state of equilibrium by application of an electromagnetic pulse of appropriate frequency (RF pulse) while the magnetic field extends perpendicularly to the z-axis, so that the magnetization performs a precessional motion about the z-axis.

Any variation of the magnetization can be detected by means of receiving RF antennas, which are arranged and oriented within an examination volume of the MR device in such a manner that the variation of the magnetization is measured in the direction perpendicularly to the z-axis.

In order to realize spatial resolution in the body, constant magnetic field gradients extending along the three main axes are superposed on the uniform magnetic field, leading to a linear spatial dependency of the spin resonance frequency. The signal picked up in the receiving antennas then contains components of different frequencies which can be associated with different locations in the body.

The signal data obtained via the receiving antennas corresponds to the spatial frequency domain and is called k-space data. The k-space data usually includes multiple lines acquired with different phase encoding. Each line is digitized by collecting a number of samples. A set of samples of k-space data is converted to an MR image, e.g. by means of Fourier transformation.

One special application of magnetic resonance imaging (MRI) is the assessment of vascular permeability and tissue perfusion, blood volume and flow, respectively. A way to obtain this information is the performance of dynamic contrast enhanced MRI (DCE-MRI) and dynamic susceptibility enhanced MRI (DSE-MRI). DCE-MRI delivers information about vascular permeability, the extravascular extracellular space, and perfusion. DSE-MRI provides feedback about blood volume and flow. Here, physiologic markers are derived by pharmacokinetic modeling of the concentration of a contrast agent over time in tissue and blood after injection. Dynamic changes of the concentration determined by the dynamic change of the longitudinal relaxation rate R1 (DCE) or R2* (DSE), induced by the injection of paramagnetic contrast agents (usually gadolinium (Gd)). DCE mostly uses steady state 3D spoiled gradient echo MR sequences and short repetition and echo times (TR, TE) to quantify R1 from changes in signal intensity. However, the impact of changes in susceptibility (R2* effect) on the signal intensity are neglected to simplify the approach, which results in inaccuracies. On the other hand, DSE normally employs single shot EPI spin echo or gradient echo sequences and long TR, TE to quantify R2*, and the paramagnetic R1 effect of the agent is neglected.

It has to be noted here, that R2* denotes the transversal relaxation rate of the spin system which includes contributions due to magnetic field inhomogeneity and R1 denotes the longitudinal relaxation rate of the spin system. Throughout the description, 'relaxation behavior of the spin system' is understood as the respective relaxation rate or relaxation time which is the inverse of the relaxation rate.

Dynamic oxygen or carbon dioxide enhanced MRI (D(C)O2E-MRI) is currently achieving increasing interest for the assessment of tissue oxygenation and vasoreactivity. These are important parameters for the selection of cancer treatments. E.g. the efficiency of radiation therapies depends on the oxygenation level of tumors.

The technique normally applies (multi-)gradient echo sequences for R2* quantification during oxygen or carbon dioxide breathing. Changes of R2* reflect changes in blood oxygenation or blood flow and volume, respectively. Concurrent changes of R1, induced by dissolved oxygen and flow, are physiologically interesting but are far lower in amplitude and difficult to measure (time consuming) and are thus mostly left unconsidered.

The simultaneous measurement of R1 and R2* in those dynamic approaches bears the potential to either improve accuracy (DCE) or specificity (concurrent physiologic measurement) of the physiologic output.

SUMMARY OF THE INVENTION

From the foregoing it is readily appreciated that there is a need for an improved MR imaging method. It is consequently an object of the invention to enable MR image for simultaneous exact determination of a longitudinal relaxation behavior and a transversal relaxation behavior of a nuclear spin system of an object.

In accordance with the invention, a magnetic resonance imaging method is presented for simultaneous determination of a longitudinal relaxation behavior and a transversal relaxation behavior of the nuclear spin system of an object. The method comprises exciting the nuclear spins by applying a steady state gradient echo pulse sequence, wherein said pulse sequence comprises a series of typically (but not restricted to) small flip angle RF excitation pulses for driving the nuclear spin magnetization to a steady state level.

Each of said RF excitation pulses is followed by a multi-gradient echo readout train generating multiple gradient echoes. The method comprises acquiring MR signal data of said gradient echoes in between the application of subsequent RF excitation pulses of the steady state gradient echo pulse sequence and to use these data for the reconstruction of multiple images. This set of images—either in k-space or in real image space—representing the signal decay after RF-excitation of the steady-state multi-gradient echo sequence, is referred to as one dynamic multi-gradient-echo data set.

Further, the method comprises the acquisition of at least two of these dynamic multi-gradient-echo data sets to perform measurements at at least two time points. Further, from the first dynamic multi-gradient-echo data set, obtained with the steady state multi gradient echo pulse sequence, a baseline transversal relaxation behavior of the spin system and a baseline equilibrium magnetization of the spin system are determined for a first time point. From the second dynamic multi-gradient-echo data set, obtained with the steady-state multi-gradient echo sequence, the equilibrium magnetization for a second time point is obtained. Further, from the second dynamic multi-gradient-echo data set a dynamic transversal relaxation behavior of the spin system is determined. Further, from the equilibrium magnetization and the baseline equilibrium magnetization, a dynamic longitudinal relaxation behavior of the spin system at the second time point is determined. The determination process as for the second dynamic multi-gradient-echo data set is used for all possible following dynamic multi-gradient-echo data sets.

Embodiments of the invention have the advantage, that both relaxation behaviors, i.e. R1 and R2* or the respective relaxation times T1 and T2* can be obtained simultaneously and independently from each other. The accuracy of conventional dynamic R1 measurements is improved and the total data acquisition process for obtaining the longitudinal and transversal relaxation behavior is accelerated.

In accordance with a further embodiment of the invention, the determination of the dynamic longitudinal relaxation behavior further comprises relating the equilibrium magnetization of the spin system to the baseline equilibrium magnetization and determining from said relation the dynamic longitudinal relaxation behavior. This has the advantage that various system dependencies and respective artifacts for example due to the used coil system are eliminated thus further improving the quality of the resulting determined dynamic longitudinal relaxation behavior.

In accordance with a further embodiment of the invention, the steady state multi gradient echo pulse sequence is a spoiled steady state gradient echo pulse sequence, wherein said sequence comprises spoiler gradients (gradient spoiling) before the RF excitation pulses, wherein the spoiler gradients are applied after each multi-gradient echo readout train. This has the further advantage that any remaining transverse magnetization is dephased such that it does not produce any signal in a subsequent signal readout. Consequently, again the quality of the measurements is improved.

In accordance with a further embodiment of the invention, the steady state gradient echo pulse sequence is a T1 weighted fast field echo pulse sequence ($T_1$FFE), using non-constant RF excitation phases (RF-spoiling). However, any steady state multi gradient echo pulse sequence may be applied, for example also a turbo field echo sequence (TFE). The $T_1$FFE sequence has the advantage that the determination of the longitudinal relaxation behavior of the spin system is further enhanced and simplified.

In accordance with a further embodiment of the invention, the method further comprises a pharmacokinetic modeling of the dynamic change of the dynamic transversal and/or longitudinal relaxation behavior over the series of RF excitation pulses. Consequently, dynamic R2* and R1 curves may be obtained from the same measurement for example after a gadolinium (GD) injection thus carrying joint information about tissue perfusion, blood flow and volume and vascular permeability. Alternatively, the concurrent measurement of R2* and R1 during oxygen breathing delivers joint information about blood and tissue oxygenation.

In accordance with a further embodiment of the invention, the magnetic resonance imaging method comprises a dynamic contrast enhanced or dynamic susceptibility enhanced MRI method. In other words, to increase the accuracy, the simultaneous relaxometry aspect supports concurrent and thus efficient DCE-DSE physiologic measurements.

In accordance with a further embodiment of the invention, the method further comprises determining an baseline longitudinal relaxation behavior of the spin system describing the longitudinal relaxation behavior of the spin system in the absence of the steady state multi gradient echo pulse sequence, wherein the method further comprises determining from said dynamic magnetization data the dynamic longitudinal relaxation behavior.

This accuracy can be even further improved by additionally determining the flip angle of the RF excitation pulses and by employing said determined flip angle in the determination of the dynamic longitudinal relaxation behavior. Consequently, also any theoretical assumptions regarding the flip angles of the RF excitation pulses can be avoided.

The method of the invention can be advantageously carried out in most MR devices in clinical use at present. To this end, it is merely necessary to utilize a computer program by which the MR device is controlled such that it performs the above explained method steps of the invention. The computer program may be present either on a data carrier or be present in a data network so as to be downloaded for installation in the control unit of the MR device. Therefore, the invention also relates to a computer program product comprising computer executable instructions to perform the method as described above.

Further, the invention relates to a magnetic resonance imaging apparatus for simultaneous determination of a longitudinal relaxation behavior and the transversal relaxation behavior of the nuclear spin system of an object.

The apparatus comprises a magnetic resonance imaging scanner for acquiring magnetic resonance image data, wherein the apparatus further comprises a controller adapted for controlling a scanner operation of:

exciting the nuclear spins by applying a steady-state gradient-echo pulse sequence, wherein said pulse sequence comprises a series of small flip angle RF excitation pulses for driving the nuclear spin magnetization to a steady-state level, wherein each of said RF excitation pulses is followed by a multi gradient echo readout train generating multiple gradient echoes, acquiring MR signal data of said gradient echoes in between the application of subsequent RF excitation pulses of the steady-state gradient-echo pulse sequence, wherein the apparatus further comprises a data reconstruction or analysis system adapted for:

reconstructing from said MR signal data at a first point in time a first dynamic multi-gradient-echo data set and at a second point in time a second dynamic multi-gradient echo data set, determining from the first dynamic multi-gradient-echo data set a baseline transversal relaxation behavior of the spin system and a baseline equilibrium magnetization of the spin system, determining from the second dynamic multi-gradient-echo data set an equilibrium magnetization of the spin system, determining from the second dynamic multi-gradient-echo data set a dynamic transversal relaxation behavior the spin system, determining from the baseline equilibrium magnetization of the spin system and the equilibrium magnetization of the spin system a dynamic longitudinal relaxation behavior of the spin system.

BRIEF DESCRIPTION OF THE DRAWINGS

The enclosed drawings disclose preferred embodiments of the present invention. It should be understood, however, that the drawings are designed for the purpose of illustration only and not as a definition of the limits of the invention. In the drawings.

DETAILED DESCRIPTION OF EMBODIMENTS

Figure 1:
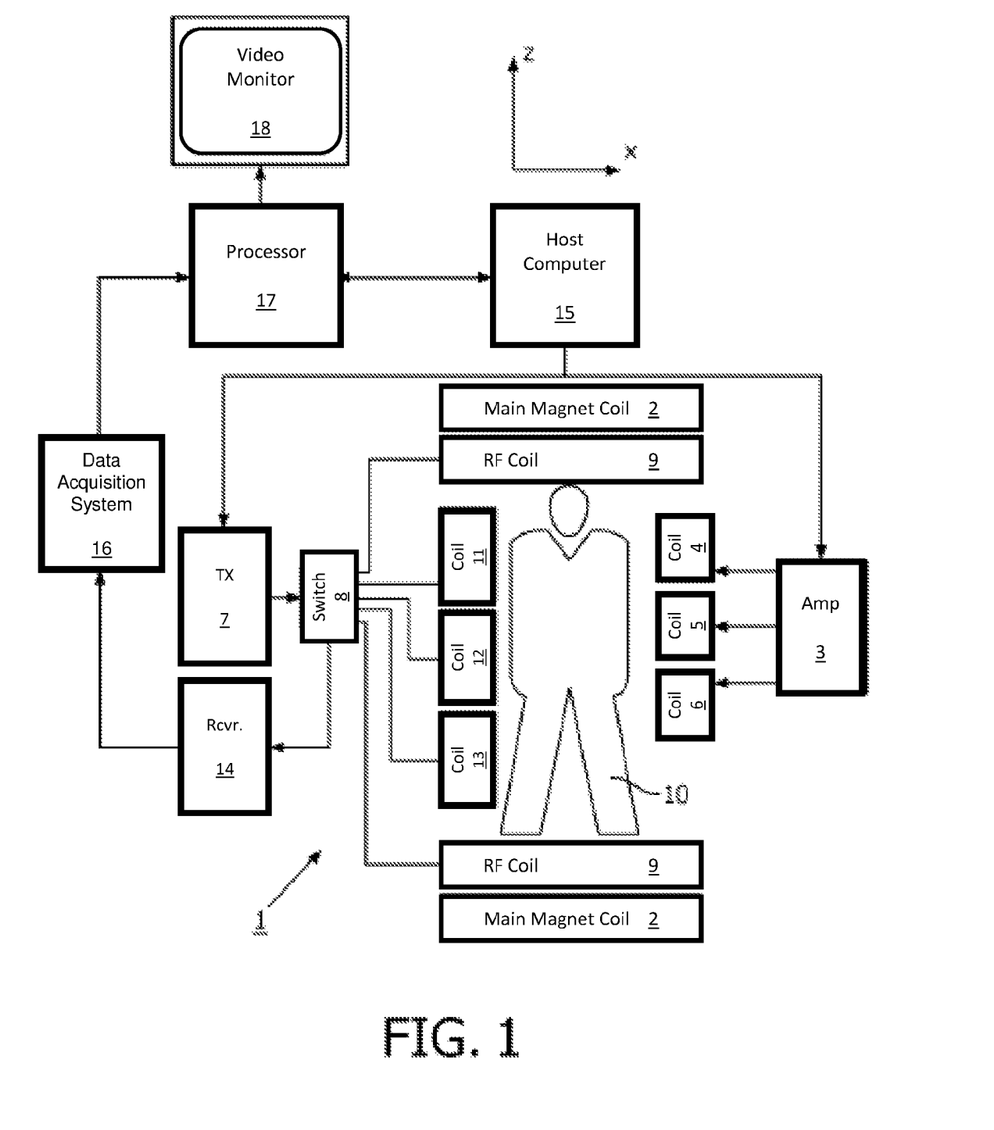
FIG. 1 shows an MR device for carrying out the method of the invention.

With reference to FIG. 1, an MR imaging system 1 is shown. The system comprises superconducting or resistive main magnet coils 2 such that a substantially uniform, temporarily constant main magnetic field $B_0$ is created along a z-axis through an examination volume.

A magnetic resonance generation manipulation system applies a series of RF pulses and switched magnetic field gradients to invert or excite nuclear magnetic spins, induce magnetic resonance, refocus magnetic resonance, manipulate magnetic resonance, spatially or otherwise encode the magnetic resonance, saturate spins and the like to perform MR imaging.

More specifically, a gradient pulse amplifier 3 applies current pulses to selected ones of whole body gradient coils 4, 5 and 6 along x, y and z-axes of the examination volume. An RF transmitter 7 transmits RF pulses or pulse packets, via a send/receive switch 8 to an RF antenna 9 to transmit RF pulses into the examination volume. A typical MR imaging sequence is composed of a packet of RF pulse sequences of short duration which taken together with each other and any applied magnetic field gradients achieve a selected manipulation of nuclear magnetic resonance. The RF pulses are used to saturate, excite resonance, invert magnetization, refocus resonance, or manipulate resonance and select a portion of a body 10 positioned in the examination volume. The MR signals may also be picked up by the RF antenna 9.

For generation of MR images of limited regions of the body or in general object 10, for example by means of parallel imaging, a set of local array RF coils 11, 12 and 13 are placed contiguous to the region selected for imaging. The array coils 11, 12 and 13 can be used to receive MR signals induced by RF transmissions effected via the RF antenna. However, it is also possible to use the array coils 11, 12 and 13 to transmit RF signals to the examination volume.

The resultant MR signals are picked up by the RF antenna 9 and/or by the array of RF coils 11, 12 and 13 and are demodulated by a receiver 14 preferably including a preamplifier (not shown). The receiver 14 is connected to the RF coils 9, 11, 12 and 13 via a send/receive switch 8.

A host computer 15 controls the gradient pulse amplifier 3 and the transmitter 7 to generate any of a plurality of imaging sequences, such as echo planar imaging (EPI), echo volume imaging, gradient and spin echo imaging, fast spin echo imaging and the like. This includes the generation of imaging sequences as described above for the determination of the longitudinal relaxation behavior and the transversal relaxation behavior of the nuclear spin system of the object 10.

For the selected sequence, the receiver 14 receives a single or a plurality of MR data lines in a rapid succession following each RF excitation pulse. A data acquisition system 16 performs analogue to digital conversion of the received signals and converts each MR data line to a digital format suitable for further processing. In modern MR devices the data acquisition system 16 is a separate computer which is specialized in acquisition of raw image data.

Ultimately, the digital raw image data is reconstructed into an image representation by a reconstruction processor 17 which applies a Fourier transform or other appropriate reconstruction algorithms, as described above with respect to the determination of the longitudinal relaxation behavior and the transversal relaxation behavior of the nuclear spin system of the object 10. The MR image may represent a planar slice through the patient, an array of parallel planar slices, a three-dimensional volume or the like. The image is then stored in an image memory where it may be accessed for converting slices or other portions of the image representation into appropriate formats for visualization, for example via a video monitor 18 which provides a man readable display of the resultant MR image.

Figure 2A:
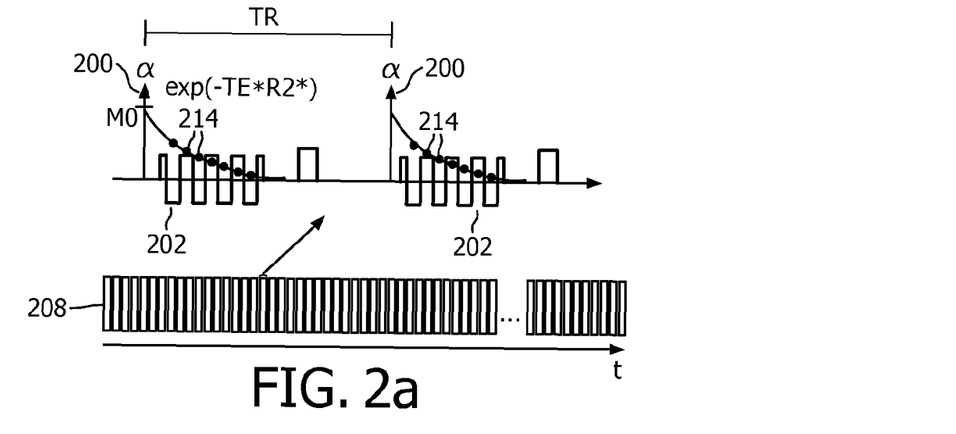
FIG. 2 illustrates the concept of simultaneous determination of the longitudinal and transversal relaxation behavior of the nuclear spin system.

FIG. 2a illustrates the concept of state of the art transversal relaxation behavior, especially R2* measurements. R2* quantification is normally based on the acquisition of multiple gradient echo images at different echo times after RF excitation. As shown in FIG. 2a, an RF excitation pulse 200 with flip angle α is applied, followed by a set of readout gradients 202 and multiple image acquisition points 214. As illustrated in FIG. 2, the magnetization M decreases from an initial magnetization value $M_0$ over time. R2* is quantified as the relaxation rate constant of the exponential decay of the signal intensity S over all echoes:

$$S = M0 \cdot \exp(-TE \cdot R2^*) = M0 \cdot E2 \qquad \text{Eq. 1}$$

The grey shaded blocks 208 in FIG. 2a indicate the individual scans of the multi-gradient echo sequence, wherein the multiple RF excitation pulses are spaced by the time TR.

Figure 2B:
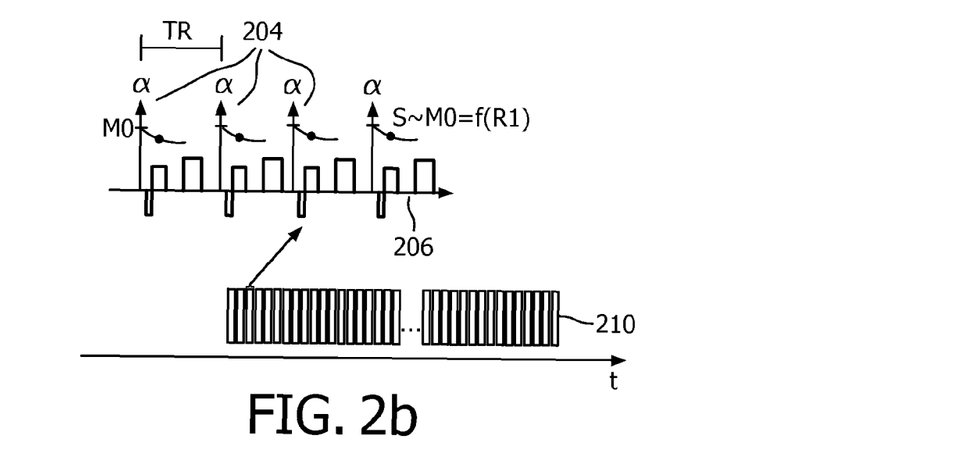

FIG. 2b illustrates the concept of state of the art dynamic R1 quantification by means of a steady state spoiled gradient echo sequence. The sequence comprises a set of small angle (spoiled) (α) RF pulses 204 which are applied to the spin system at short repetition times TR. In each individual RF pulse 204, readout gradients 206 and spoiler gradients are applied to dephase any remaining transverse magnetization. The small flip angle RF excitation pulses 204 are applied in the presence of for example slice select gradients and respective MR signal data is acquired during a data acquisition window in the presence of the readout gradient 206.

For imaging purposes, the pulse sequence may be repeated at said intervals TR and the phase encoding gradient may be stepped through a set of values to acquire a complete sampling of k-space from which an image may be reconstructed. So the scan time is determined by the number of phase encodings. The purpose of RF and gradient spoiling is, that typically TR is less than the transversal relaxation time such that transverse magnetization remains at the end of each individual scan 210 (each scan 210 comprising the RF pulse 204 in the respective readout gradient 206). By means of the spoiler gradients remaining transverse magnetization is dephased such that it is not influencing the readout MR signal.

One approach to very fast R1 quantification is to exploit the R1-dependent equilibrium magnetization of steady-state (TR<1/R1) spoiled gradient-echo sequences. In the following, the acquired signal is denoted by S:

$$S = \kappa \cdot \sin\alpha \cdot \underbrace{\frac{1-E1}{1-\cos\alpha \cdot E1}}_{M0} E2, \qquad \text{Eq. 2a}$$

with $E1 = \exp(-TR \cdot R1)$, $E2 = \exp(-TE \cdot R2^*)$

Normally, short echo times are used $TE<1/R2^*$ and the $R2^*$-dependent exponential E2 is neglected, and thus—as mentioned above—also the influence of $R2^*$ changes:

$$S \approx M0 = \kappa \cdot \sin\alpha \cdot \frac{1-E1}{1-\cos\alpha \cdot E1}, \qquad \text{Eq. 2b}$$

for $TE < 1/R2^*$

Dynamic changes of R1 (i.e. $R1_t$) are then quantified based on the change of signal $S_t$ at time point t with respect to the baseline signal $S_{t=0}$ (e.g. first scan of dynamic series):

$$\frac{S_t}{S_{t=0}} = \frac{1-E1_t}{1-\cos\alpha \cdot E1_t} \frac{1-\cos\alpha \cdot E1_0}{1-E1_0} \qquad \text{Eq. 3}$$

$E1_0$ and $E1_t$ are the intrinsic ($\exp(-TR \cdot R1_0)$) and the dynamic ($\exp(-TR \cdot R1_t)$) exponential terms, respectively. Spoiling, as mentioned above, (by phase scrambling using RF spoiling and crusher gradients before each RF pulse) is important to eliminate the contribution of any prior transverse magnetization to a signal following an RF pulse.

From Eq. 3 and further (for example theoretical) assumptions of the flip angle α and $R1_0$, the dynamic longitudinal relaxation rate $R1_t$ can be estimated.

Figure 2C:
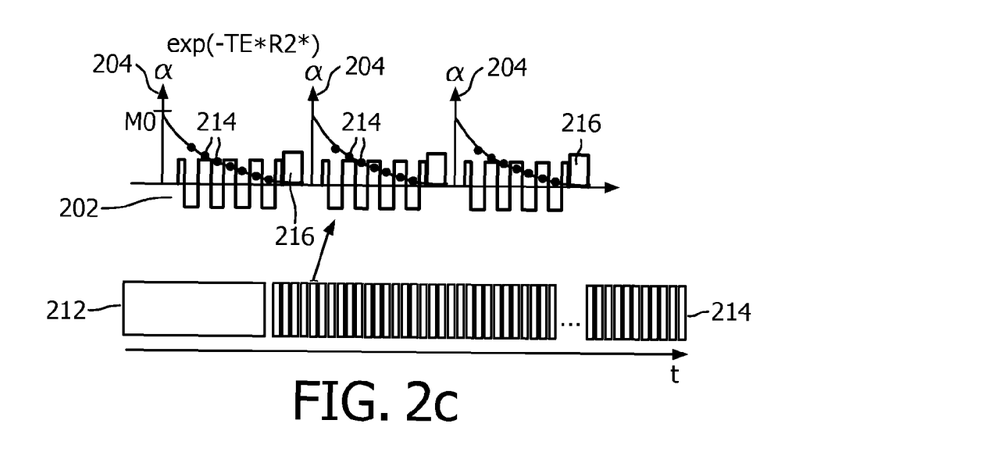

FIG. 2c illustrates the concept of simultaneous determination of the longitudinal and transversal relaxation behavior of the nuclear spin system. The invention proposes the combination of the two concepts shown in FIG. 2a and FIG. 2b, whereas the combination can be either understood as the extension of the dynamic R1 quantification concept by a multi-gradient echo readout or as a dynamic steady state $R2^*$ quantification concept extended by an $R1_0$ quantification.

In the combination of these two concepts as illustrated in FIG. 2c, a series of RF excitation pulses 204 are applied for driving the nuclear spin magnetization to a steady state level. Each of the RF excitation pulses 204 is followed by a multi-gradient echo readout train 202, wherein this readout train generates multiple gradient echoes which are acquired as MR signal data with multiple image acquisition steps, denoted by the bullets 214. Further, by means of spoiler gradient pulses 216 residual transverse magnetization is spoiled after the application of each individual multi-gradient echo readout train. In FIG. 2c, individual scans, each scan comprising a series of RF excitation pulses 204 and readout gradients 202, are denoted by the blocks 214. By successively repeating the blocks 214 (i.e. the scans), a quantification of R1 and $R2^*$ as well as dynamic R1 and $R2^*$ changes can be obtained.

Optionally, as denoted by reference numeral 212, a baseline longitudinal relaxation behavior of the spin system describing the longitudinal relaxation behavior of the spin system in the absence of the steady state gradient echo pulse sequence may be determined, resulting in $R1_0$. For example, said baseline longitudinal relaxation behavior of the spin system may be determined before any contrast media is injected or oxygen is breathed, (D(C)O2E-MRI). The steady-state sequence itself has no influence on R1. The respective scan may be either performed before performing the scans 214 or after performing the scans 214, in either case when the spin system is fully returned back to the equilibrium value.

Also optionally, the scan 212 may comprise a determination of the exact flip angle of the RF excitation pulses, wherein afterwards said flip angle is employed in the determination of the longitudinal relaxation behavior obtained from the scans 214.

Figure 3:
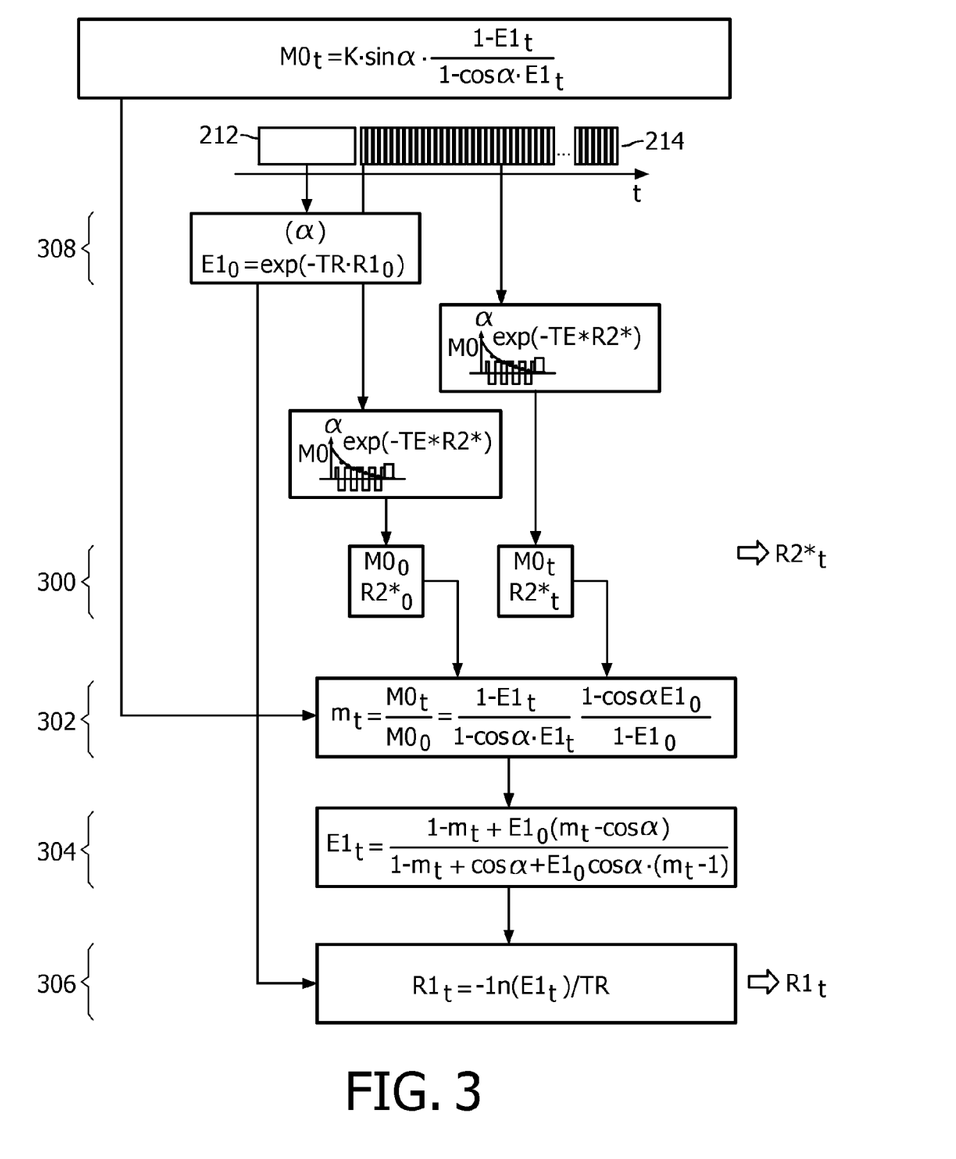
FIG. 3 is a flowchart illustrating the dynamic processing steps for a simultaneous determination of the transversal and longitudinal relaxation behavior of a spin system.

FIG. 3 is a flowchart illustrating the dynamic processing steps for a simultaneously determination of the transversal and longitudinal relaxation behavior of a spin system. The multi-gradient echo signals of each individual scan 214 deliver an exponential decay of the signal intensity over all echoes, as discussed with respect to equation 1. Consequently, for each dynamic step (for each scan) $R2^*_t$ (dynamic transversal relaxation rate) and $M0_t$ (dynamic magnetization) can be obtained at each dynamic point in time for example by using exponential fits or numerical approaches to solve equation 1. Further, from the MR signal data acquired in the first scan a static transversal relaxation behavior of the spin system ($R2^*_0$) and a static equilibrium magnetization of the spin system ($M0_0$) may be obtained in step 300.

In the following, step 302 is discussed: according to the steady state signal equation for spoiled gradient echo short TR sequences, M0 is a function of R1 but independent from $R2^*$. The division of $M0_t$ and $M0_0$ further eliminates the system related constant κ and the sin α term.

In step 304, dynamic changes of $R1_t$ are then quantified, wherein the equation denoted in step 304 is obtained by solving the equation denoted in step 302 for $E1_t$. The remaining variables in step 304 are $E1_0$, the flip angle α and TR. These values may have either been obtained from additional a-priori measurements in step 308 (scan 212 in FIG. 2c) or are sequence specific constants (TR, α).

Finally, in step 306 $R1_1$ is obtained from the logarithm of $E1_t$.

It has to be noted that the additional (optional) B1 measurement in scan 212 (step 308) can further improve the accuracy of the approach by including a true flip angle determination. Due to the high scan efficiency, variable flip angle approaches are often used for $R1_0$ quantification but Look-Locker, inversion recovery TSE or simultaneous B1 and $R1_0$ mapping techniques are, of course, also applicable.

A feature of the invention is the combination of R1 and R2* quantification methods such that, opposed to standard dynamic R1 or standard R2* measurements as used e.g. in DCE- and DSE-MRI, both relaxation rate values are delivered simultaneously and independent from each other. The accuracy of conventional dynamic R1 measurements is improved, since the E2 term in Eq. 2 does not need to be neglected anymore, but is derived from the multi-gradient-echo signal. Next to the increase in accuracy, the simultaneous relaxometry aspect supports concurrent, and thus efficient, DCE-DSE physiologic measurements. The dynamic R2* and R1 curves obtained from the same measurement after Gd injection carry joint information about tissue perfusion, flow and vascular permeability.

The invention might even be more important in D(C)O2E-MRI experiments. The inhalation of oxygen and $CO_2$ enriched gases alters blood and tissue oxygenation and blood flow and volume, respectively, yielding feedback about oxygenation and vasoreactivity. Concurrent R1 and R2* sequences are expected to increase specificity and to avoid "false negatives" (see section on background). R2* is sensitive to changes in blood oxygenation, flow and volume whereas R1 is sensitive to changes in the concentration of the dissolved molecular oxygen in tissue and liquids and, dependent on the sequence, also to changes in flow.

Figure 4:
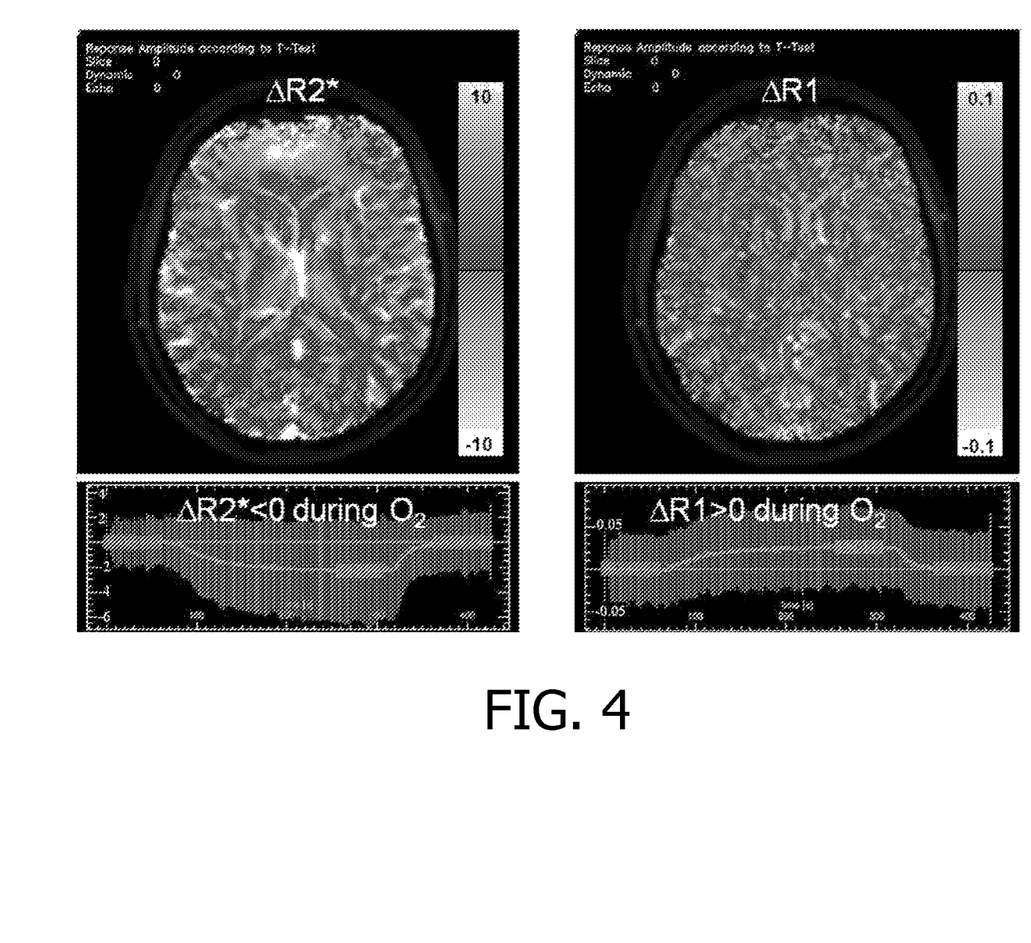
FIG. 4 depicts the R2* and R1 response maps of a healthy volunteer to Carbogen (95%).

A proof-of concept is demonstrated in FIG. 4. The figure depicts the R2* (left) and R1 (right) response maps of a healthy volunteer to Carbogen (95%). The increase of blood oxygenation results in a decrease of R2* over time and the elevated amount of dissolved paramagnetic molecular oxygen in plasma and tissue as well as the elevated blood flow velocity result in an increase of R1 over time. Although very low in amplitude (factor of 100 lower than the effect of R2*), the dynamic change of R1 can be quantified within seconds. In this 2D example the temporal resolution was 2.1 s/frame and the inplane spatial resolution was less than 2 mm.

The increase of flow and molecular oxygen in tissue and plasma results in subtle R1 changes that can be quantified with a temporal resolution of 2.1 s at 3T. The elevated blood oxygenation level results in much higher R2* changes (factor 100), which were quantified simultaneously by means of the method discussed above.

This approach can further support quantitative monitoring of the delivery and distribution of contrast agents that exploit both R1-related and susceptibility mechanisms.

The invention claimed is:

1. A magnetic resonance imaging method permitting simultaneous determination of a longitudinal relaxation behavior (R1) and a transversal relaxation behavior (R2, R2*) of the nuclear spin system of an object, the method comprising:
   exciting the nuclear spin system of an object by applying a steady-state gradient-echo pulse sequence with a magnetic resonance imaging system, wherein said steady-state gradient-echo pulse sequence comprises:
      a series of RF excitation pulses that drive the nuclear spin magnetization up to a steady-state level, wherein each of said RF excitation pulses of the series, is followed by a multi gradient echo readout train, that generates multiple gradient echoes;
   wherein the magnetic resonance imaging method further comprises:
      acquiring with said magnetic resonance imaging system MR signal data resulting from said applied gradient echoes in between the application of subsequent RF excitation pulses in the series of the steady-state gradient-echo pulse sequence; and
   reconstructing, with a computer processor of said magnetic resonance imaging system, from said acquired MR signal data occurring at a first point in time, a first dynamic multi-gradient-echo data set, and a second dynamic multi-gradient echo data set occurring at a second point in time,
   wherein with said computer processor of the magnetic resonance imaging system, the method further comprises:
      (a) determining from the reconstructed first dynamic multi-gradient-echo data set, baseline transversal relaxation behavior (R2, R2*) of the nuclear spin system and a baseline equilibrium magnetization of the nuclear spin system,
      (b) determining from the reconstructed second dynamic multi-gradient-echo data set, an equilibrium magnetization of the nuclear spin system,
      (c) determining further from the reconstructed second dynamic multi-gradient-echo data set, a dynamic transversal relaxation behavior (R2, R2*) of the nuclear spin system,
      (d) determining, from the determined baseline equilibrium magnetization of the nuclear spin system of (a), and the determined equilibrium magnetization of the nuclear spin system of (a), a dynamic longitudinal relaxation behavior (R1) of the spin system and
      (e) providing the measurements of: 1) the baseline transversal relaxation behavior (R2, R2*) of the nuclear spin system; 2) the baseline equilibrium magnetization of the nuclear spin system; 3) the equilibrium magnetization of the nuclear spin system; 4) the dynamic transversal relaxation behavior (R2, R2*) of the nuclear spin system; and 5) the dynamic longitudinal relaxation behavior (R1) of the spin system, to either a user, a display, or a memory, wherein the determination of the dynamic longitudinal relaxation behavior (R1) and the dynamic transversal relaxation behavior (R2, R2*) of the nuclear spin system of an object are determined simultaneously in a concurrent measurement by said computer processor of the magnetic resonance imaging system.

2. The method of claim 1, wherein the determination of the dynamic longitudinal relaxation behavior (R1) further comprises using the determined equilibrium magnetization of the nuclear spin system in order to relate the determined equilibrium magnetization of the nuclear spin system with respect to the determined baseline equilibrium magnetization of the nuclear spin system and determining therefrom the dynamic longitudinal relaxation behavior (R1).

3. The method of claim 1, wherein the steady-state multi gradient-echo pulse sequence is a spoiled steady-state gradient-echo pulse sequence, with said sequence comprising:
   spoiler gradients before the applied series of RF excitation pulses, wherein the spoiler gradients are applied after each multi gradient echo readout train.

4. The method of claim 1, wherein the steady-state multi gradient-echo pulse sequence of claim 1, is a T1 weighted fast field echo pulse sequence.

5. The method of claim 1, further comprising a pharmacokinetic modeling of the dynamic change of the dynamic transversal (R2, R2*) and/or longitudinal (R1) relaxation behavior over the series of RF excitation pulses.

6. The method of claim 5, wherein the magnetic resonance imaging method comprises: either a dynamic contrast enhanced or a dynamic susceptibility enhanced MRI method.

7. The method of claim 1, further comprising
determining with said computer processor of the magnetic resonance imaging system, a baseline longitudinal relaxation behavior (R1) of the nuclear spin system describing the longitudinal relaxation behavior (R1) of the spin system in the absence of the steady-state multi gradient-echo pulse sequence,
wherein the method further comprises
determining with said computer processor of the magnetic resonance imaging system, from said baseline longitudinal relaxation behavior (R1) the dynamic longitudinal relaxation behavior (R1) which is then provided to either a user, a display, or a memory.

8. The method of claim 1, further comprising
determining with said computer processor of the magnetic resonance imaging system, the flip angle of the applied series of RF excitation pulses,
wherein said flip angle is employed in the determination of the dynamic longitudinal relaxation behavior (R1), by said computer processor of the magnetic resonance imaging system, which is then provided to either a user, a display, or a memory.

9. A non-transitory computer readable medium comprising instructions that when executed by a computer perform the magnetic resonance imaging method of claim 1.

10. A magnetic resonance imaging (MRI) apparatus permitting simultaneous determination of a longitudinal relaxation behavior (R1) and a transversal relaxation behavior (R2, R2*) of the nuclear spin system of an object, wherein the apparatus comprises:
   a magnetic resonance imaging scanner configured for acquiring magnetic resonance image data, wherein the MRI apparatus further comprises
   a controller configured for controlling an MRI scanner operation of:
      exciting the nuclear spin system of an object by applying a steady-state gradient-echo pulse sequence with the MRI scanner, wherein said steady-state gradient-echo pulse sequence comprises:
         a series of small flip angle RF excitation pulses that drive the nuclear spin magnetization upto a steady-state level, wherein each of said RF excitation pulses of the series, is followed by a multi gradient echo readout train, that generates multiple gradient echoes;
      acquiring with said MRI scanner, MR signal data resulting from said applied gradient echoes in between the application of subsequent RF excitation pulses in the series of the steady-state gradient-echo pulse sequence; and
wherein the MRI scanner, apparatus further comprises:
   a data reconstruction system configured for: reconstructing from said acquired MR signal data occurring at a first point in time, a first dynamic multi-gradient-echo data set and a second dynamic multi-gradient echo data set occurring at a second point in time,
wherein with said computer processor of the MRI scanner performing the method steps of:
   (a) determining from the reconstructed first dynamic multi-gradient-echo data set, baseline transversal relaxation behavior (R2, R2*) of the nuclear spin system and a baseline equilibrium magnetization of the nuclear spin system,
   (b) determining from the reconstructed second dynamic multi-gradient-echo data set, a dynamic transversal relaxation behavior (R2, or R2*) of the nuclear spin system, the spin system,
   (c) determining further from the reconstructed second dynamic multi-gradient-echo data set, an equilibrium magnetization of the nuclear spin system,
   (d) determining, from the determined baseline equilibrium magnetization of the nuclear spin system of (a), and the determined equilibrium magnetization of the nuclear spin system of (a), a dynamic longitudinal relaxation behavior (R1) of the spin system and
   (e) providing the measurements of: 1) the determined baseline transversal relaxation behavior (R2, R2*) of the nuclear spin system; 2) the determined baseline equilibrium magnetization of the nuclear spin system; 3) the determined dynamic transversal relaxation behavior (R2, R2*) of the nuclear spin system, 4) the determined equilibrium magnetization of the nuclear spin system; and 5) the determined dynamic longitudinal relaxation behavior (R1) of the spin system, either to a user, a display, or a memory, wherein the determination of the dynamic longitudinal relaxation behavior (R1) and the dynamic transversal relaxation behavior (R2, R2*) of the nuclear spin system of an object is determined simultaneously in a concurrent measurement by said computer processor of the MRI scanner.

* * * * *